United States Patent
Zhang et al.

(10) Patent No.: US 11,412,624 B2
(45) Date of Patent: Aug. 9, 2022

(54) DISPLAY PANEL, DISPLAY DEVICE AND METHOD FOR CONFIGURING DISPLAY PANEL

(71) Applicant: Wuhan Tianma Micro-Electronics Co., Ltd., Wuhan (CN)

(72) Inventors: Jianji Zhang, Wuhan (CN); Jiang Chen, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 486 days.

(21) Appl. No.: 16/672,141

(22) Filed: Nov. 1, 2019

(65) Prior Publication Data

US 2020/0068727 A1   Feb. 27, 2020

(30) Foreign Application Priority Data

May 31, 2019   (CN) .......................... 201910471541.5

(51) Int. Cl.
| | |
|---|---|
| *G06F 1/16* | (2006.01) |
| *H05K 5/00* | (2006.01) |
| *H05K 5/02* | (2006.01) |
| *H05K 7/20* | (2006.01) |

(52) U.S. Cl.
CPC ......... *H05K 5/0017* (2013.01); *G06F 1/1652* (2013.01); *H05K 5/0217* (2013.01); *H05K 7/20954* (2013.01)

(58) Field of Classification Search
CPC .................................................... G06F 1/1652
See application file for complete search history.

(56) References Cited

U.S. PATENT DOCUMENTS

| | | | | |
|---|---|---|---|---|
| 4,923,057 | A * | 5/1990 | Carlson | E04B 1/98 267/136 |
| 6,940,497 | B2 * | 9/2005 | Vincent | G06F 1/1615 345/206 |
| 9,208,664 | B1 * | 12/2015 | Peters | G06F 3/00 |
| 9,405,368 | B2 * | 8/2016 | Modarres | G06F 3/016 |
| 10,042,385 | B2 * | 8/2018 | Lai | G06F 1/1601 |
| 10,257,929 | B2 * | 4/2019 | Lim | H05K 1/0277 |
| 10,274,994 | B2 * | 4/2019 | Zhao | G09F 9/00 |
| 10,503,262 | B2 * | 12/2019 | Modarres | G06F 3/016 |
| 10,571,961 | B2 * | 2/2020 | Lee | G06F 1/1641 |

(Continued)

FOREIGN PATENT DOCUMENTS

| | | |
|---|---|---|
| CN | 105608999 A | 5/2016 |
| CN | 109584719 A | 4/2019 |

*Primary Examiner* — Adrian S Wilson
(74) *Attorney, Agent, or Firm* — Alston & Bird LLP

(57) ABSTRACT

Provided are a display panel, a display device, and a method for configuring a display panel. The display panel includes a display function layer, a support layer and a storage structure, where the support layer is disposed on one side of the display function layer and is in contact with the display function layer; the support layer includes a first cavity and is connected to the storage structure; and the storage structure is provided with a storage unit and is capable of moving a phase changing material from the storage unit into the first cavity or moving the phase changing material from the first cavity into the storage unit. A heater and a cooler are applied to switch the phase changing material between the solid and the liquid phases.

20 Claims, 8 Drawing Sheets

(56) References Cited

U.S. PATENT DOCUMENTS

| | | | |
|---|---|---|---|
| 10,920,806 B2* | 2/2021 | Zhao | G06F 3/041 |
| 11,003,216 B2* | 5/2021 | Chen | G06F 1/1652 |
| 11,116,094 B2* | 9/2021 | Zhao | G06F 1/1616 |
| 11,127,322 B2* | 9/2021 | Han | G09F 9/301 |
| 11,132,028 B2* | 9/2021 | Zeng | G06F 1/1656 |
| 11,246,232 B2* | 2/2022 | Zhu | G09F 9/301 |
| 11,250,734 B2* | 2/2022 | Li | G06F 1/1616 |
| 2008/0018603 A1* | 1/2008 | Baraz | G06F 1/1639 |
| | | | 345/168 |
| 2008/0158171 A1* | 7/2008 | Wong | G06F 3/0412 |
| | | | 345/173 |
| 2012/0075782 A1* | 3/2012 | Wu | G09F 9/301 |
| | | | 361/679.01 |
| 2013/0271913 A1* | 10/2013 | MacDonald | F28F 23/00 |
| | | | 361/679.52 |
| 2014/0160078 A1* | 6/2014 | Seo | G04G 17/08 |
| | | | 345/175 |
| 2014/0268555 A1* | 9/2014 | Kurczewski | G06F 1/1679 |
| | | | 361/679.55 |
| 2014/0285417 A1* | 9/2014 | Johan | G06F 1/1694 |
| | | | 345/156 |
| 2014/0320396 A1* | 10/2014 | Modarres | G06F 3/0412 |
| | | | 345/156 |
| 2015/0029229 A1* | 1/2015 | Voutsas | G06F 1/1647 |
| | | | 345/1.3 |
| 2015/0029658 A1* | 1/2015 | Yairi | G06F 1/203 |
| | | | 361/679.47 |
| 2015/0055308 A1* | 2/2015 | Lim | G04G 21/08 |
| | | | 264/480 |
| 2015/0205420 A1* | 7/2015 | Calub | G06F 1/1643 |
| | | | 345/173 |
| 2015/0220117 A1* | 8/2015 | Lee | G06F 1/169 |
| | | | 361/749 |
| 2016/0224066 A1* | 8/2016 | Hussa | H04M 1/0268 |
| 2016/0259430 A1* | 9/2016 | Hong | G06F 1/163 |
| 2016/0306392 A1* | 10/2016 | Park | G02B 1/14 |
| 2016/0323966 A1* | 11/2016 | Hamel | G09F 9/372 |
| 2017/0147046 A1* | 5/2017 | Chen | G06F 1/1658 |
| 2018/0059822 A1* | 3/2018 | Seo | G06F 3/04166 |
| 2018/0129245 A1* | 5/2018 | Lai | G02F 1/133308 |
| 2018/0224941 A1* | 8/2018 | Modarres | G06F 3/0488 |
| 2018/0364764 A1* | 12/2018 | Lin | G06F 1/1656 |
| 2019/0089820 A1* | 3/2019 | Lin | H04M 1/0216 |
| 2019/0166696 A1* | 5/2019 | Lin | G06F 1/1652 |
| 2021/0150942 A1* | 5/2021 | Han | G09F 9/301 |
| 2021/0274665 A1* | 9/2021 | Zhu | H05K 5/0217 |

* cited by examiner

DISPLAY PANEL, DISPLAY DEVICE AND METHOD FOR CONFIGURING DISPLAY PANEL

CROSS-REFERENCES TO RELATED APPLICATIONS

This application claims priority to a Chinese patent application No. CN20190471541. 5 filed at CNIPA on May 31, 2019, the disclosure of which is incorporated herein by reference in its entirety.

TECHNICAL FIELD

The present disclosure relates to display techniques and, in particular, to a display panel, a display device and a method for configuring a display panel.

BACKGROUND

A flexible display unit can be folded and curled, and has a lot of applications in the field of mobile display technologies.

However, compared with a rigid display unit using a glass pane, the flexible display unit is difficult to remain flat in use. In some current applications, structural members are employed to support the flexible screen. However, too many structural members may greatly limit the extent that the flexible display unit is foldable and curled, and too few structural members result in weak support when the flexible display unit is held and touched, which affects the quality of the flexible display unit.

SUMMARY

The present disclosure provide a display panel, a display device and a method for configuring a display panel to support the display panel and facilitate the use of the display panel.

In a first aspect, an embodiment of the present disclosure provides a display panel. The display panel includes a display function layer, a support layer and a storage structure disposed next to one sidewall of the support layer, where the storage structure is provided with a storage unit.

The support layer is disposed on one side of the display function layer and is in contact with the display function layer, and the support layer includes a first cavity. The storage structure is configured to move a phase changing material between the storage unit and the first cavity.

In a second aspect, an embodiment of the present disclosure further provides a display device. The display device includes any display panel described in the first aspect.

In a third aspect, an embodiment of the present disclosure further provides a method for configuring a display panel. The display panel includes a display function layer, a support layer and a storage structure disposed next to one sidewall of the support layer, where the storage structure is provided with a storage unit; where the support layer is disposed on one side of the display function layer and is in contact with the display function layer; the support layer includes a first cavity and is connected to the storage structure; the storage structure is provided with a storage unit for storing a phase changing material; a heating device is disposed within the storage unit and on a side of the support layer facing way from the display function layer, separately; and a cooling device is disposed on the side of the support layer facing way from the display function layer.

The method includes steps described below. When the display function layer is drawn out of a second cavity through a receiving opening, the heating device within the storage unit heats the phase changing material within the storage unit to change the phase changing material from a solid state to a liquid state. The storage structure guides the phase changing material in the liquid state within the storage unit into the first cavity. The cooling device on the side of the support layer facing away from the display function layer cools the phase changing material within the first cavity to change the phase changing material from the liquid state to the solid state to support the display function layer.

DETAILED DESCRIPTION

Figure 1:
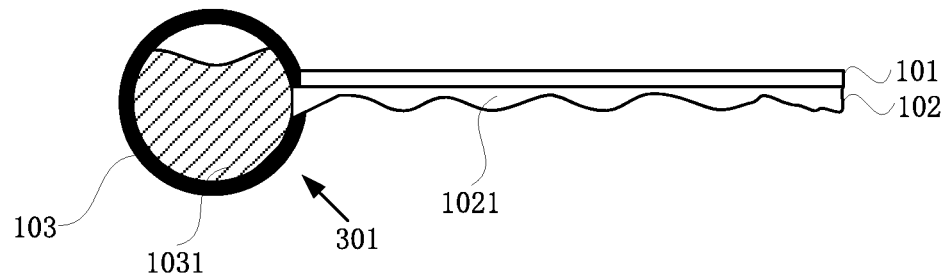
FIG. 1 is a structural diagram of a display panel according to an embodiment of the present disclosure.

Hereinafter the present disclosure will be further described in detail in conjunction with the drawings and embodiments. It is to be understood that the specific embodiments set forth below are intended to illustrate and not to limit the present disclosure. Additionally, it is to be noted that, for ease of description, only part, not all, of the structures related to the present disclosure are illustrated in the drawings.

FIG. 1 is a structural diagram of a display panel according to an embodiment of the present disclosure. With reference to FIG. 1, the display panel includes a display function layer 101, a support layer 102 and a storage structure 301.

The support layer 102 is disposed on one side of the display function layer 101 and is in contact with the display function layer 101. The support layer 102 includes a first cavity 1021 and is connected to the storage structure 301.

The storage structure is provided with a storage unit 103 and is capable of guiding a phase changing material 1031 from the storage unit 103 into the first cavity 1021 or guiding the phase changing material from the first cavity 1021 into the storage unit 103.

Figure 2:
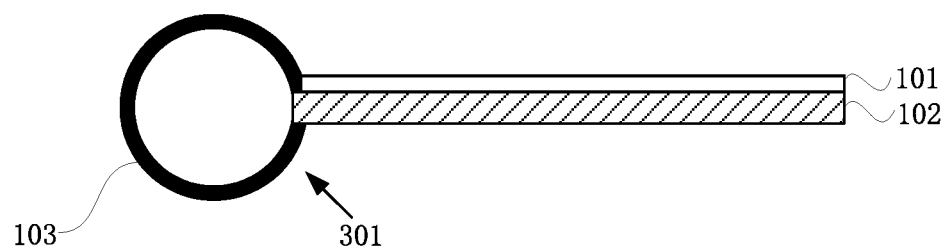
FIG. 2 is a structural diagram of a display panel with a phase changing material guided into a support layer according to an embodiment of the present disclosure.

Specifically, FIG. 2 is a structural diagram of a display panel with a phase changing material guided into a support layer according to an embodiment of the present disclosure. With reference to FIG. 1 and FIG. 2, the display function layer 101 may be a flexible display unit. When operations such as a touch needs to be performed on the display panel, the storage structure 301 is capable of guiding the phase changing material 1031 within the storage unit 103 into the first cavity 1021 of the support layer 102, so that the support layer 102 is filled with the phase changing material 1031 and thus has enough hardness to support the display function layer 101, thereby facilitating operations such as holding, display, and touches on the display panel. The phase changing material 1031 may be a solid-liquid phase changing material. When the display function layer 101 does not need to be supported, the solid-liquid phase changing material is stored within the storage unit 103 in its solid state, convenient to be stored and moved. When the display function layer 101 needs to be supported, the solid-liquid phase changing material within the storage unit 103 is switched from its solid state to its liquid state and thus is convenient to be guided into the support layer 102. After the solid-liquid phase changing material in the liquid state is guided into the support layer 102 by the storage structure 301, the solid-liquid phase changing material in the support layer 102 is changed into the solid state so as to provide enough hardness to support the display function layer 101. Meanwhile, the storage structure 301 may also guide part of the solid-liquid phase changing material in the liquid state into the support layer 102, and the solid-liquid phase changing material in the support layer 102 is changed into the solid state to support part of the display function layer 101 so that the display panel may have display effects of various sizes and be applied within a larger range.

Apply the technical solution in this embodiment, by use of the display panel including the display function layer, the support layer and the storage structure, when the display function layer needs to be supported, the phase changing material within the storage unit is guided into the support layer to provide the support layer with enough hardness to support the display function layer, so that the display function layer remains flat and straight and is convenient to be touched and held; when the display function layer does not need to be supported, the phase changing material in the support layer is guided into the storage unit and the support layer no longer has enough hardness, so that the display panel is convenient to be curled. Therefore, it is greatly convenient to curl, touch and hold the display panel. Meanwhile, the storage structure may also guide part of the solid-liquid phase changing material into the support layer to partially support the display function layer so that the display panel may have display effects of various sizes and be applied within a larger range.

Optionally, the support layer 102 may be made of flexible materials, for example, the support layer 102 may be made of flexible plastics. After the phase changing material in the first cavity 1021 is guided into the storage unit, the flexible plastics have a good bending property, so bending of the display panel is not enabled.

Figure 3:
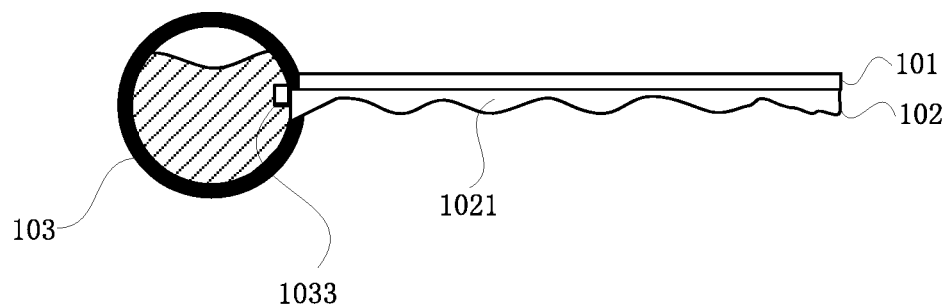
FIG. 3 is a structural diagram of another display panel according to an embodiment of the present disclosure.

Optionally, FIG. 3 is a structural diagram of another display panel according to an embodiment of the present disclosure. With reference to FIG. 3, a pump 1033 is disposed at a position where the storage unit 103 is connected to the support layer 1021, and the storage unit 103 may be configured as a flexible housing. When the phase changing material needs to be guided from the storage unit 103 into the first cavity 1021 of the support layer 102, the pump 1033 pumps the phase changing material in the liquid state within the storage unit 103 into the first cavity 1021, and since the storage unit 103 is the flexible housing and pressure in the storage unit 103 becomes smaller due to a decrease of the phase changing material in the liquid state within the storage unit 103, the storage unit 103 deforms under atmospheric pressure, so that the pressure in the storage unit 103 is sufficient to make the pump 1033 pump the phase changing material in the liquid state into the first cavity 1021. Accordingly, the support layer 102 may also be made of flexible materials. When the phase changing material needs to be guided from the first cavity 1021 of the support layer 102 into the storage unit 103, the pump 1033 pumps the phase changing material in the liquid state within the first cavity 1021 into the storage unit 103, and since the support layer 102 is made of a flexible material, and the pressure in the support layer 102 is reduced due to a decrease in liquid-state quantity of the phase changing material in the support layer 102, the support layer 102 deforms under the ambient pressure, so that the pressure in the support layer 102 is sufficient to enable the pump 1033 to move the phase changing material in the liquid state from the support layer into the storage unit 103. The pump 1033 may also guide inert gases by which the phase changing material in the liquid state is pressed to be guided between the storage unit 103 and the first cavity 1021. Alternatively, the phase changing material in the liquid state is guided between the storage unit 103 and the first cavity 1021 under gravity. For example, when the phase changing material in the liquid state needs to be guided from the storage unit 103 into the first cavity 1021, the storage unit 103 may be directly placed at a place with high potential energy, and the first cavity 1021 may be placed at a place with low potential energy, so that the phase changing material in the liquid state within the storage unit 103 flows into the first cavity 1021 under the gravity. In this case, a pump is not required, and the display panel has a simple structure, thereby reducing costs of the display panel.

Figure 4:
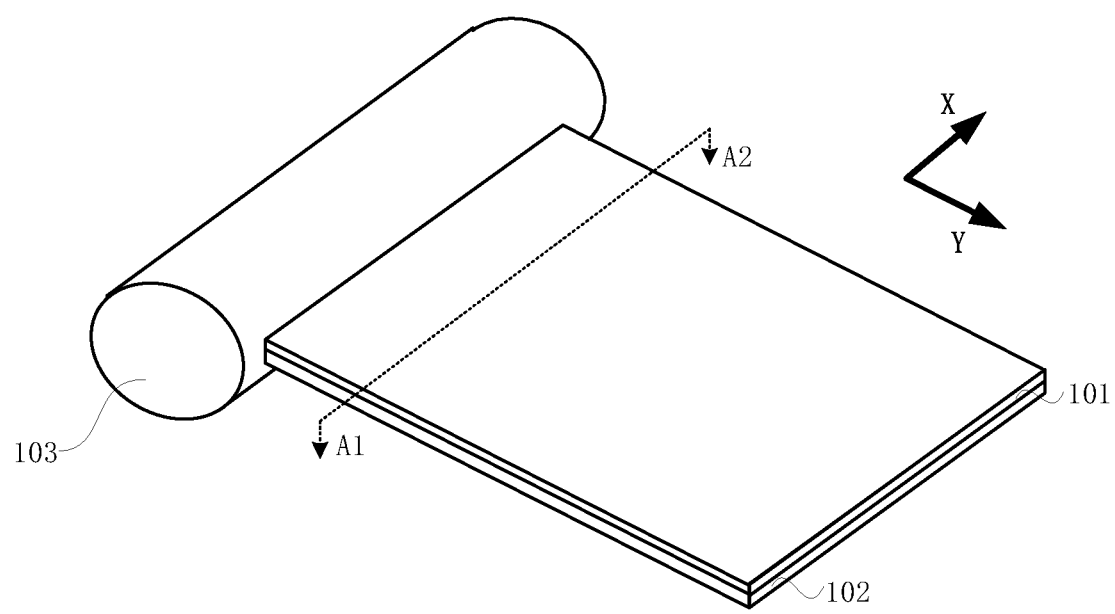
FIG. 4 is a structural diagram of another display panel according to an embodiment of the present disclosure.
Figure 5:
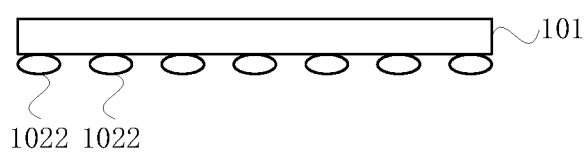
FIG. 5 is a cross sectional view taken along a line A1-A2 in FIG. 4.

Optionally, FIG. 4 is a structural diagram of another display panel according to an embodiment of the present disclosure. FIG. 5 is a sectional view taken along a line A1-A2 in FIG. 4. With reference to FIG. 1 to FIG. 5, the first cavity 1021 includes a plurality of uniformly distributed strip cavities 1022.

Exemplarily, the plurality of strip cavities 1022 are arranged along a first direction X and extend along a second direction Y, and the phase changing material within the storage unit 103 is guided into the plurality of the strip cavities 1022 along the second direction; where the first direction X is perpendicular to the second direction Y. The plurality of strip cavities 1022 are uniformly distributed at equal intervals on the one side of the display function layer 101. The phase changing material in the storage unit 103 may be separately guided into the plurality of uniformly distributed strip cavities 1022 when being guided into the first cavity 1021, so that the phase changing material can provide uniform support for the display function layer 101, avoiding a case where the display function layer 101 is ununiformly supported due to the non-uniform distribution of the phase changing material within the first cavity 1021 when a single first cavity 1021 is disposed and the support layer 102 may deform arbitrarily and ensuring use effects.

Meanwhile, it may be set that the plurality of strip cavities 1022 have the same width along the first direction X, that is, the plurality of strip cavities 1022 have the same shape and size, so that the phase changing material is uniformly distributed on the one side of the display function layer 101, thereby providing uniform support for the display function layer 101.

Figure 6:
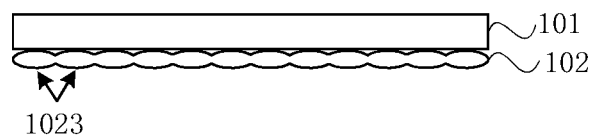
FIG. 6 is another cross sectional view taken along a line A1-A2 in FIG. 4.

Optionally, FIG. 6 is another sectional view taken along the line A1-A2 in FIG. 4. With reference to FIG. 6, at least two adjacent strip cavities 1023 are interconnected with each other.

Specifically, any two adjacent strip cavities 1023 may be set to be interconnected with each other. At this time, a contact area between the plurality of strip cavities 1023 and the display function layer 101 is relatively large. After the strip cavities 1023 are filled with the phase changing material, a small portion of the display function layer 101 is not supported by the strip cavities 1023. Meanwhile, since the strip cavities 1023 can hinder maximum deformation, after the phase changing material is guided into the strip cavities 1023, the plurality of strip cavities 1023 have the same deformation state, that is, the phase changing material is uniformly distributed on the one side of the display function layer 101, so that the uniform support is provided for the display function layer 101, avoiding a case where inconsistent deformation states of portions of the support layer 102 results in an inability of the display function layer 101 to remain flat and straight and affected use of the display panel.

Figure 7:
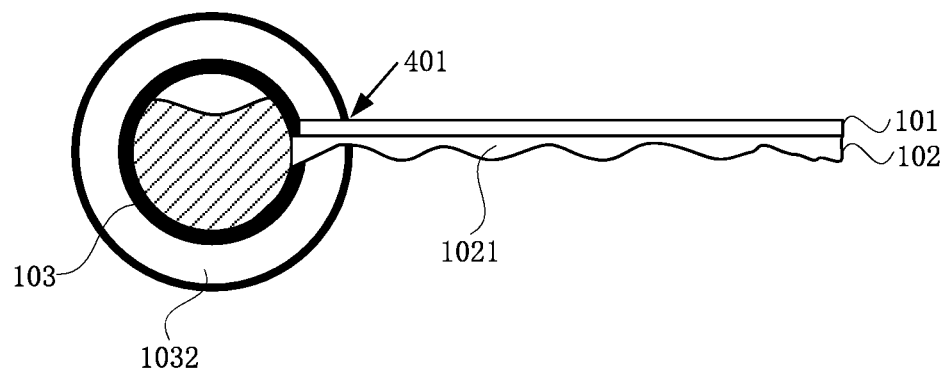
FIG. 7 is a structural diagram of another display panel according to an embodiment of the present disclosure.

Optionally, FIG. 7 is a structural diagram of another display panel according to an embodiment of the present disclosure. With reference to FIG. 7, the storage structure further includes a second cavity 1032 for accommodating the display function layer 101 and the support layer 102. The second cavity 1032 is provided with a receiving opening 401 through which the display function layer 101 and the support layer 102 are capable of being drawn into or out of the second cavity 1032.

Figure 8:
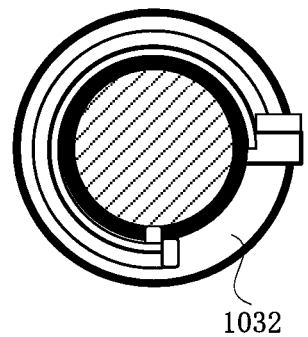
FIG. 8 is a structural diagram of another display panel according to an embodiment of the present disclosure.

Exemplarily, FIG. 8 is a structural diagram of another display panel according to an embodiment of the present disclosure, With reference to FIG. 7 and FIG. 8, when the display function layer 101 does not need to display, the phase changing material is guided from the first cavity 1021 of the support layer 102 to the storage unit 103, and the display function layer 101 and the support layer 102 are drawn into the second cavity 1032 to form a structure shown in FIG. 8. In this case, the display panel occupies small space and is convenient to carry. However, when the display function layer 101 needs to display, the display function layer 101 and the support layer 102 are drawn out of the second cavity 1032, and the phase changing material in the liquid state is guided from the storage unit 103 to the first cavity 1021 of the support layer 102 to support the display function layer 101. Meanwhile, the display function layer 101 may be partially unfolded, that is, the display function layer 101 and the support layer 102 are partially drawn out of the second cavity 1032, and an amount of the phase changing material guided into the first cavity 1021 is controlled. For example, the amount of the phase changing material guided into the first cavity 1021 is controlled by controlling working time of the pump, so as to provide the support required by part of the display function layer 101, thereby enabling the display panel to have display effects of various sizes and expanding an application range of the display panel.

Optionally, still referring to FIG. 8, the storage unit 103 is a storage tank which is a cylinder. The display function layer 101 and the support layer 102 can be curled around the storage tank.

The storage tank adopts a cylinder structure, so that portions of the display function layer 101 have the same bending degree when the display function layer 101 is curled around the storage tank, thereby avoiding the problem of a short service life due to some seriously curled portions of the display function layer 101 since the portions of the display function layer 101 have inconsistent bending degrees.

Optionally, still referring to FIG. 8, the second cavity 1032 is in a ring shape and disposed around the storage unit 103.

Specifically, the second cavity 1032 is configured as a ring, and the second cavity 1032 may be provided with a rigid housing. After the display function layer 101 and the support layer 102 are drawn into the second cavity 1032, the rigid housing may protect the display function layer and the support layer within the second cavity 1032 from being damaged. Meanwhile, due to a design of the ring structure, the ring structure has the largest accommodation space when the same amount of materials is employed, so that larger display function layer 101 and larger support layer 102 may be accommodated under the same costs.

Figure 9:
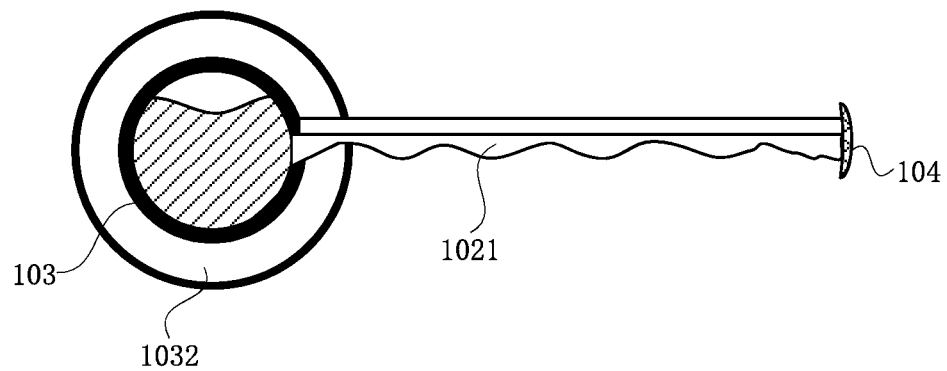
FIG. 9 is a structural diagram of another display panel according to an embodiment of the present disclosure.
Figure 10:
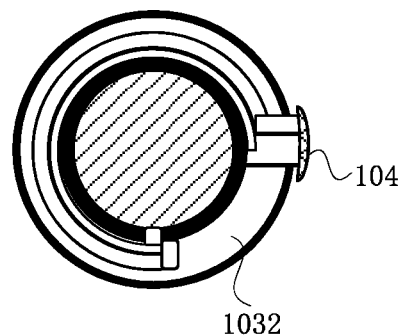
FIG. 10 is a structural diagram of another display panel according to an embodiment of the present disclosure.

Optionally, FIG. 9 is a structural diagram of another display panel according to an embodiment of the present disclosure. FIG. 10 is a structural diagram of another display panel according to an embodiment of the present disclosure. With reference to FIG. 9 and FIG. 10, the support layer 102 and the display function layer 101 are provided with a handle 104 on a side of the support layer 102 and the display function layer 101 facing away from the storage structure.

Specifically, the handle 104 may be configured to draw the display function layer 101 and the support layer 102 out of the second cavity 1032 when the display function layer 101 and the support layer 102 are curled around the storage tank, avoiding the problem that an end of the display function layer 101 is easily damaged and the service life of the display panel is affected because the end of the display function layer 101 needs to be clamped to draw the display function layer 101 and the support layer 102 out of the second cavity 1032 when the handle 104 is not disposed. With reference to FIG. 10, after both the display function layer 101 and the support layer 102 are drawn into the second cavity 1032, the pull-out handle 104 is in contact with the storage structure, i.e., the housing of the second cavity 1032. A shape of the pull-out handle 104 may be set to match a shape of the receiving opening on the storage structure. If the receiving opening is arc-shaped, the pull-out handle 104 may also be set to be arc-shaped, so that the pull-out handle 104 may cover the receiving opening, thereby preventing pollutants from entering into the second cavity 1032 to pollute the display function layer 101 when the display panel is not in use, and prolonging the service life of the display panel. Meanwhile, after the display function layer and the support layer are received, the pull-out handle 104 may also clamp the display function layer 101 to prevent the display function layer 101 from being further received and prevent the display function layer 101 from being difficult to be drawn out of the second cavity 1032 due to excessive receiving.

Figure 11:
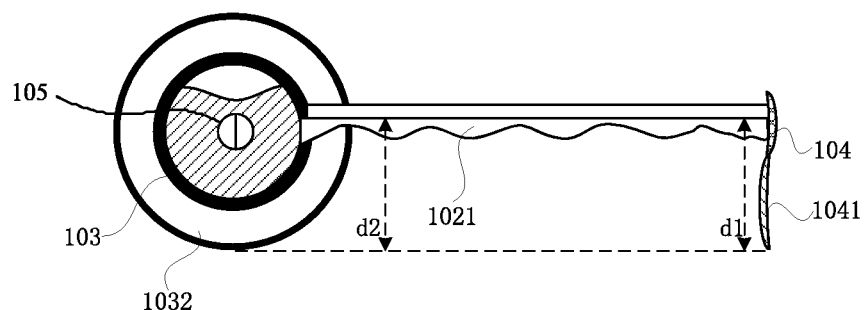
FIG. 11 is a structural diagram of another display panel according to an embodiment of the present disclosure.

Optionally, FIG. 11 is a structural diagram of another display panel according to an embodiment of the present disclosure. With reference to FIG. 11, the pull-out handle 104 is provided with a folded portion 1041. The folded portion 1041 is foldable in the direction perpendicular to the display function layer 101.

Specifically, the pull-out handle 104 is provided with the folded portion 1041. When the folded portion 1041 is unfolded, the folded portion 1041 and the housing of the second cavity 1032 support the display function layer 101 together. For example, when the display panel in this embodiment is applied to a mobile phone and a user needs to place the mobile phone on a desktop, the folded portion 1041 may make the display function layer 101 have a certain angle with the desktop, which is convenient for the user to watch a display picture. A length of the folded portion 1041 may be set according to a size of the housing of the second cavity 1032 and a size of the display function layer 101, or the length of the folded portion 1041 may be adjusted to meet requirements of various application scenarios.

Optionally, still referring to FIG. 11, when the folded portion 1041 is unfolded, in the direction of the support layer 102 facing away from the display function layer 101, a side of the folded portion 1041 facing away from the display function layer 101 has a first distance d1 from the display function layer 101, and a side of the storage structure facing away from the display function layer 101 has a second distance d2 from the display function layer 101, where the first distance d1 is equal to the second distance d2.

The first distance d1 is equal to the second distance d2, that is, when the folded portion 1041 is unfolded and the display panel is placed on a horizontal plane, a plane where the display function layer 101 is located is parallel to the horizontal plane. When the display panel is inconvenient to hold, for example, when the display panel is applied to relatively large display equipment, the display panel may be placed horizontally to provide the user with a good viewing effect.

Figure 12:
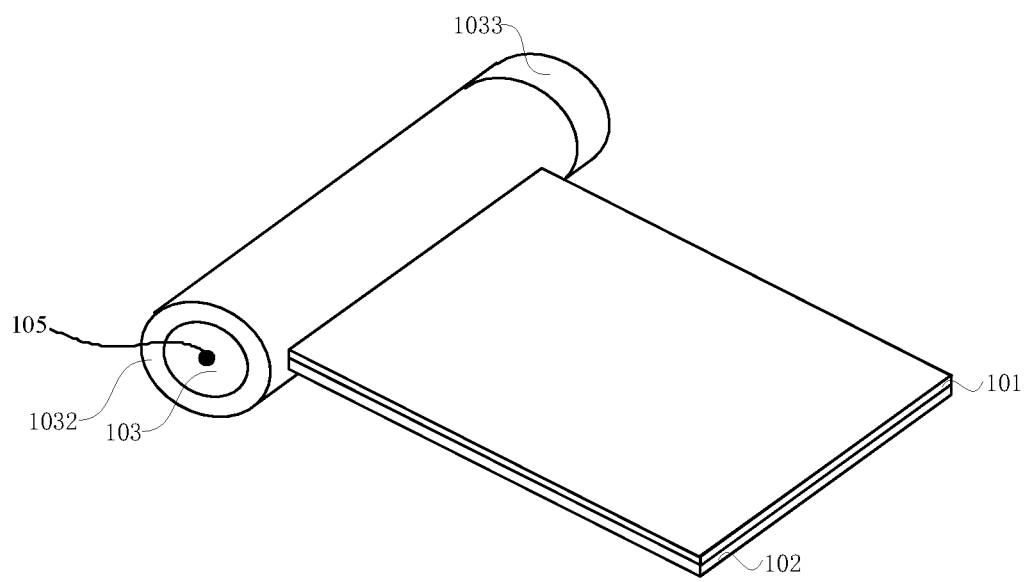
FIG. 12 is a structural diagram of another display panel according to an embodiment of the present disclosure.

Optionally, FIG. 12 is a structural diagram of another display panel according to an embodiment of the present disclosure. With reference to FIG. 12, the display panel further includes a rolling structure 1033. The storage tank includes two bottom surfaces and one lateral surface, the rolling structure 1033 is disposed on one of the two bottom surfaces of the storage tank, and the rolling structure 1033 is configured to drive the storage tank to rotate to curl the support layer and the display function layer onto the storage tank.

Specifically, the rolling structure 1033 may be a manual rolling structure. When the display function layer 101 and the support layer 102 need to be rolled onto the storage tank, the user may roll the rolling structure 1033 to drive the storage tank to rotate, so as to roll the display function layer 101 and the support layer 102 onto the storage tank. The rolling structure 1033 may also be an automatic rolling structure. For example, the rolling structure 1033 is provided with a motor. When the display function layer 101 and the support layer 102 need to be rolled onto the storage tank, the motor is operated to automatically rotate the rolling structure 1033, so as to roll the display function layer 101 and the support layer 102 onto the storage tank, thereby avoiding inconvenience of manually rolling the rolling structure 1033.

Optionally, a heating device 105 is disposed within the storage unit 103 and/or on a side of the support layer 102 facing way from the display function layer 101.

For example, the heating device may be an electric heating wire, and the electric heating wire may be uniformly disposed within the storage unit 103. When the phase changing material within the storage unit 103 needs to be guided into the support layer 102, the phase changing material within the storage unit 103 is heated by the electric heating wire to accelerate a change of the phase changing material from the solid state to the liquid state, thereby improving phase change efficiency. Meanwhile, the electric heating wire may also be uniformly disposed on the side of the support layer 102 facing away from the display function layer 101. When the phase changing material needs to be guided from the support layer 102 into the storage unit 103, the support layer 102 is heated by the electric heating wire to accelerate a change of the phase changing material in the support layer 102 from the solid state to the liquid state. The uniformly disposed electric heating wire may also enable the phase changing materials in all portions of the support layer 102 to have consistent phase change processes, thereby improving the phase change efficiency to a maximum extent.

Optionally, a cooling device is disposed at the end or the side of the support layer 102 facing way from the display function layer 101.

Exemplarily, the cooling device may be a compressor or a fan. When the phase changing material in the liquid state is guided from the storage unit 102 to the first cavity of the support layer 102, the cooling device cools the support layer 102 to accelerate a change of the phase changing material from the liquid phase to the solid phase, thereby reducing waiting time of the user and improving use experience.

Optionally, the phase changing material includes an alloy or an organic polymer material.

Exemplarily, the phase changing material may be the alloy or the organic polymer material whose melting point ranges between 40 degrees Celsius and 60 degrees Celsius, such as a Brandt alloy (Bi48Pb23Sn23Hg6) with a melting point of 38 degrees Celsius, a five-component eutectic alloy (Bi45Pb23Sn8Cd5In19) with a melting point of 47 degrees Celsius, or a four-component eutectic alloy (Bi49Pb18Sn12In21) with a melting point of 57 degrees Celsius. The phase changing material which has a melting point ranging between 40 to 60 degree Celsius is employed. When the phase changing material has a melting point lower than 40 degree Celsius, the phase changing material may be melted into the liquid state at roman ambient temperature, therefore cannot provide adequate stable support for the display function layer 101 in regular usage. When the phase changing material has a melting point higher than 60 degree Celsius, it may take a very long time for the phase changing material to switch from the solid state to the liquid state, therefore a high temperature also affects display performance of the display function layer 101. The phase changing material may be preferably the five-component eutectic alloy ($Bi_{45}Pb_{23}Sn_8Cd_5In_{19}$) with the melting point of 47 degrees Celsius, which has low costs and is beneficial to save costs. When the cooling device is disposed on the side of the support layer 102 facing away from the display function layer 101, a phase changing material whose melting point is lower than 40 degrees Celsius may also be employed. When the display panel has good heat insulation, for example, when the heat insulation between the display panel and the outside is good, the user will not be scalded when touching the display panel, and a phase changing material whose melting point is higher than 60 Celsius, such as a wood's alloy ($Bi_{50}Pb_{25}Sn_{12.5}Cd_{12.5}$) or a Lipowitz's alloy ($Bi_{50}Pb_{27}Sn_{13}Cd_{10}$) with a melting point of 70 degree Celsius, may also be employed.

Figure 13:
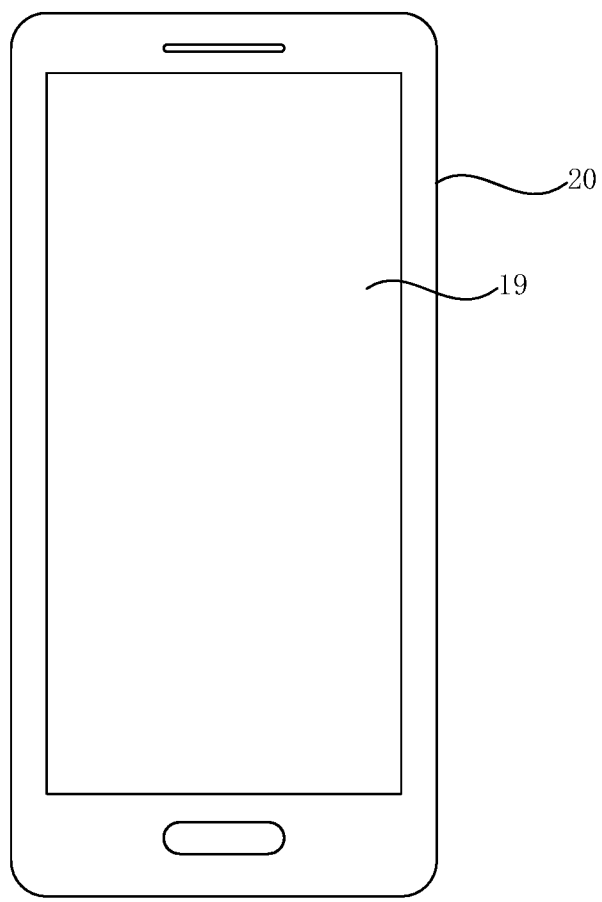
FIG. 13 is a structural diagram of a display device according to an embodiment of the present disclosure.

FIG. 13 is a structural diagram of a display device according to an embodiment of the present disclosure. With reference to FIG. 13, the display device 20 in FIG. 13 may include any display panel 19 according to the embodiments of the present disclosure. The working principles of the display device may be referred to a description of the working principles of the display panel in the embodiments of the present disclosure and are not repeated herein.

Figure 14:
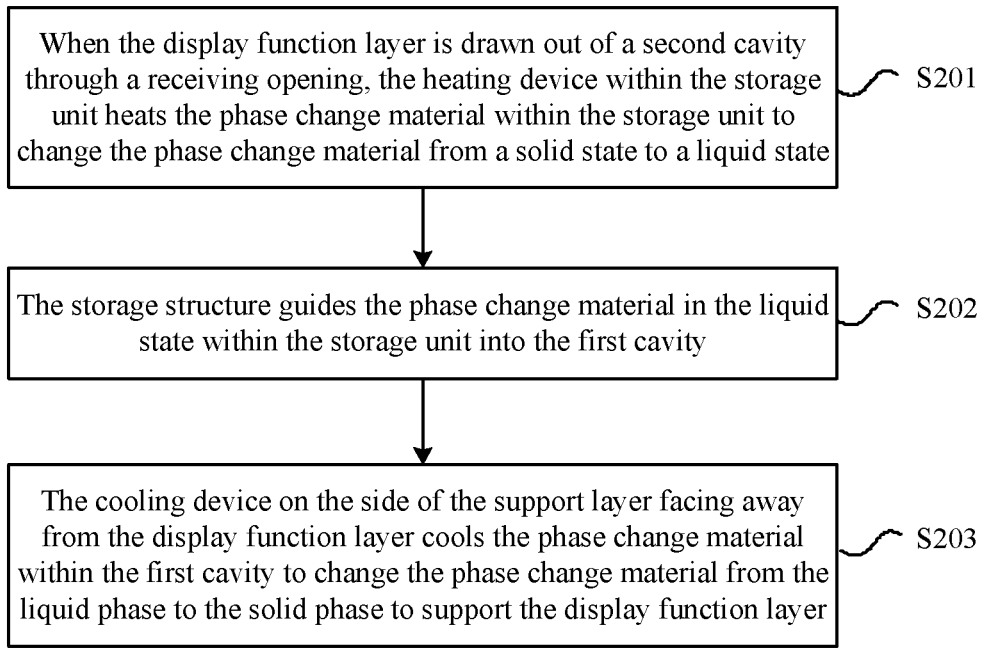
FIG. 14 is a flowchart of a method for configuring a display panel according to an embodiment of the present disclosure.

FIG. 14 is a flowchart of a method for configuring a display panel according to an embodiment of the present disclosure. A display panel includes a display function layer, a support layer and a storage structure. The support layer is disposed on one side of the display function layer and is in contact with the display function layer. The support layer includes a first cavity and is connected to the storage structure. The storage structure is provided with a storage unit for storing a phase changing material. A heating device is disposed within the storage unit and on a side of the support layer facing way from the display function layer, separately. A cooling device is disposed on the side of the support layer facing way from the display function layer.

The method for configuring a display panel includes steps described below.

In step S201, when the display function layer is drawn out of a second cavity through a receiving opening, the heating device within the storage unit heats the phase changing material within the storage unit to change the phase changing material from a solid state to a liquid state.

Specifically, a degree to which the display function layer is drawn out may be determined according to user requirements. The display function layer may be completely or partially drawn out of the second cavity.

In step S202, the storage structure guides the phase changing material in the liquid state within the storage unit into the first cavity.

Specifically, when the display function layer is completely drawn out, the storage structure guides all of the phase changing material in the liquid state within the storage unit into the first cavity; when the display function layer is partially drawn out, the storage structure guides part of the phase changing material in the liquid state within the storage unit into the first cavity, enabling the display panel to be applied to more scenarios.

In step S203, the cooling device on the side of the support layer facing away from the display function layer cools the phase changing material within the first cavity to change the phase changing material from the liquid phase to the solid phase to support the display function layer.

Specifically, the cooling device can accelerate at the same rate the phase changing material switches from the liquid state to the solid state, which can save a significant amount of time compared with waiting for natural cooling of the phase changing material.

In the technical solution in this embodiment, the phase changing material is guided from storage unit into the first cavity when the display panel is used, the degree to which the display function layer is drawn out may be controlled by a user, and an amount of the phase changing material guided into the first cavity may also be controllable, which greatly expands the use of the display panel.

Figure 15:
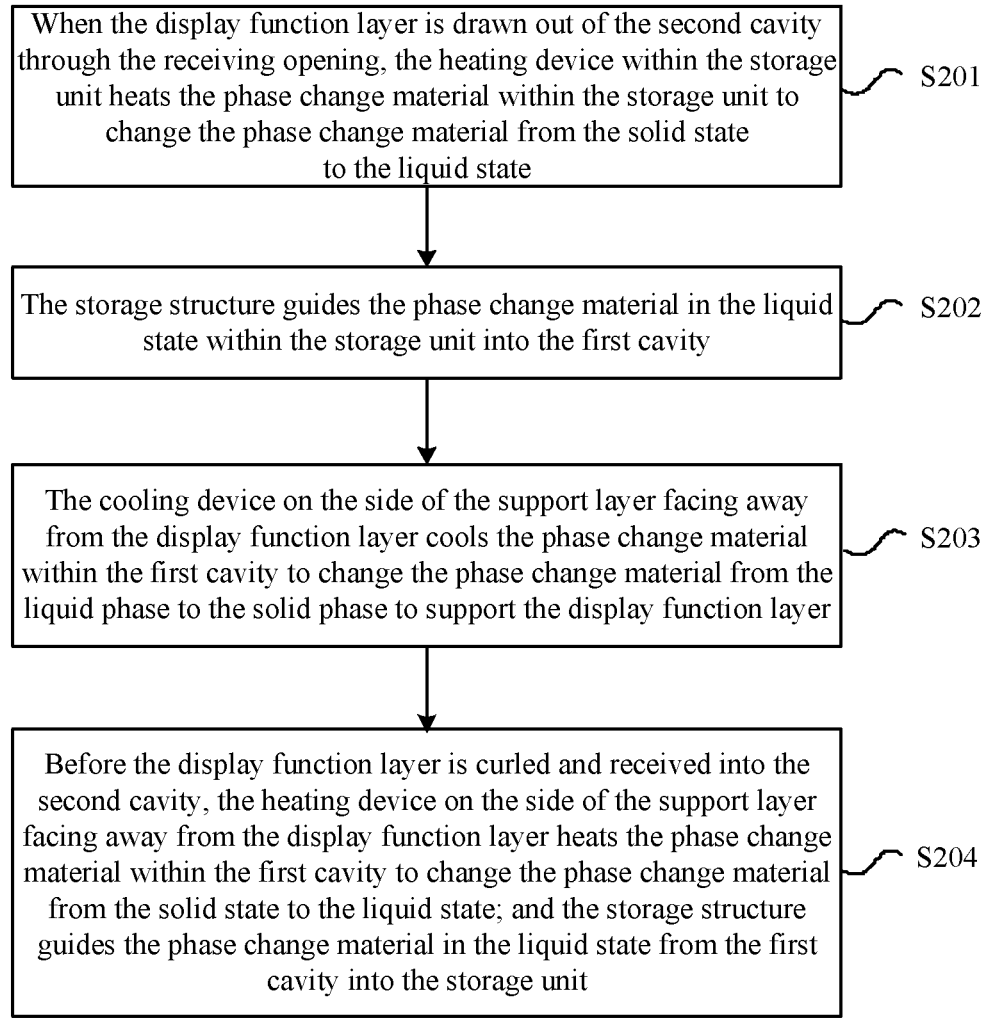
FIG. 15 is a flowchart of another method for configuring a display panel according to an embodiment of the present disclosure.

Optionally, FIG. 15 is a flowchart of another method for configuring a display panel according to an embodiment of the present disclosure. With reference to FIG. 15, the method for configuring a display panel includes steps described below.

In step S201, when the display function layer is drawn out of the second cavity through the receiving opening, the heating device within the storage unit heats the phase changing material within the storage unit to change the phase changing material from the solid state to the liquid state.

In step S202, the storage structure guides the phase changing material in the liquid state within the storage unit into the first cavity.

In step S203, the cooling device on the side of the support layer facing away from the display function layer cools the phase changing material within the first cavity to change the phase changing material from the liquid state to the solid state to support the display function layer.

In step S204, before the display function layer is curled and received into the second cavity, the heating device on the side of the support layer facing away from the display function layer heats the phase changing material within the first cavity to switch the phase changing material from the solid state to the liquid state; and the storage structure guides the phase changing material in the liquid state from the first cavity into the storage unit.

It is to be noted that the above are merely preferred embodiments of the present disclosure and the technical principles used therein. It will be understood by those skilled in the art that the present disclosure is not limited to the specific embodiments described herein. Those skilled in the art can make various apparent modifications, adaptations and substitutions without departing from the scope of the present disclosure. Therefore, while the present disclosure has been described in detail through the above-mentioned embodiments, the present disclosure is not limited to the above-mentioned embodiments and may include more other equivalent embodiments without departing from the concept of the present disclosure. The scope of the present disclosure is determined by the scope of the appended claims.

What is claimed is:

1. A display panel, comprising:
a display function layer, a support layer, and a storage structure disposed next to one sidewall of the support layer, wherein the storage structure is provided with a storage unit;
wherein the support layer is disposed on one side of the display function layer and is in contact with the display function layer;
wherein the support layer comprises a first cavity; and
wherein the storage structure is configured to move a phase changing material between the storage unit and the first cavity.

2. The display panel of claim 1, wherein the first cavity comprises a plurality of uniformly distributed strip cavities.

3. The display panel of claim 2, wherein the plurality of strip cavities is arranged along a first direction and extends along a second direction, wherein the first direction is perpendicular to the second direction, and wherein the phase changing material within the storage unit is moved along the second direction into the plurality of the strip cavities.

4. The display panel of claim 3, wherein at least two adjacent strip cavities among the plurality of the strip cavities are interconnected with each other.

5. The display panel of claim 1, wherein the storage structure further comprises a second cavity for accommodating the display function layer and the support layer, wherein the second cavity is provided with a receiving opening through which the display function layer and the support layer are capable of being drawn into or out of the second cavity.

6. The display panel of claim 5, wherein the storage unit is a storage tank, wherein the storage tank is a cylinder, and wherein the display function layer and the support layer are capable of curling around the storage tank.

7. The display panel of claim 5, wherein the second cavity is in a ring shape and disposed around the storage unit.

8. The display panel of claim 1, wherein a pull-out handle is provided on another sidewall of the support layer facing away from the storage structure.

9. The display panel of claim 8, wherein the pull-out handle is provided with a folded portion, wherein the folded portion is foldable in the direction perpendicular to the display function layer.

10. The display panel of claim 9, wherein when the folded portion is unfolded, in the direction perpendicular to the display function layer, a side of the folded portion facing away from the display function layer has a first distance from the display function layer, and a side of the storage structure facing away from the display function layer has a second distance from the display function layer, wherein the first distance is equal to the second distance.

11. The display panel of claim 6, further comprising a rolling structure, wherein the storage tank comprises two bottom surfaces and one lateral surface, wherein the rolling structure is disposed on one of the two bottom surfaces of the storage tank, and the rolling structure is configured to drive the storage tank to rotate to curl the support layer and the display function layer onto the storage tank.

12. The display panel of claim 1, wherein a heating device is disposed within the storage unit and/or on a side of the support layer facing way from the display function layer.

13. The display panel of claim 12, wherein the heating device is an electric heating wire.

14. The display panel of claim 1, wherein a cooling device is disposed on a side of the support layer facing way from the display function layer.

15. The display panel of claim 1, wherein the phase changing material comprises an alloy or organic polymer material.

16. The display panel of claim 15, wherein the phase changing material has a melting point between 40 to 60 degree Celsius.

17. The display panel of claim 16, wherein the phase changing material comprises a Brandt alloy, a five-component eutectic alloy or a four-component eutectic alloy.

18. A display device, comprising a display panel, wherein the display panel comprises:
a display function layer, a support layer, and a storage structure disposed next to one sidewall of the support layer, wherein the storage structure is provided with a storage unit;
wherein the support layer is disposed on one side of the display function layer and is in contact with the display function layer;
wherein the support layer comprises a first cavity; and
wherein the storage structure is configured to move a phase changing material between the storage unit and the first cavity.

19. A method for configuring a display panel, wherein the display panel comprises:
a display function layer, a support layer and a storage structure;
wherein the support layer is disposed on one side of the display function layer and is in contact with the display function layer; the support layer comprises a first cavity and is connected to the storage structure; the storage structure is provided with a storage unit for storing a phase changing material;
wherein a heating device is disposed within the storage unit and on a side of the support layer facing way from the display function layer, separately; wherein a cooling device is disposed on the side of the support layer facing way from the display function layer;
wherein the method comprises:
when the display function layer is drawn out of a second cavity through a receiving opening,
heating the phase changing material inside the storage unit to change it from a solid state to a liquid state by the heating device;
followed by moving the phase changing material in the liquid state from the storage unit into the first cavity with the storage structure; and
cooling, with the cooling device, the phase changing material within the first cavity to change from the liquid state to the solid state to support the display function layer.

20. The method of claim 19, further comprising:
before the display function layer is drawn out of the second cavity through the receiving opening,
heating, by the heating device, the phase changing material inside the first cavity to change it from the solid state to the liquid state; and
moving the phase changing material in the liquid state from the first cavity into the storage unit by the storage structure.

* * * * *